United States Patent
Schwarzenbach et al.

(10) Patent No.: US 11,127,775 B2
(45) Date of Patent: Sep. 21, 2021

(54) SUBSTRATE FOR FRONT SIDE TYPE IMAGER AND METHOD OF MANUFACTURING SUCH A SUBSTRATE

(71) Applicant: Soitec, Bernin (FR)

(72) Inventors: Walter Schwarzenbach, Saint Nazaire les Eymes (FR); Oleg Kononchuk, Theys (FR); Ludovic Ecarnot, Grenoble (FR); Christelle Michau, Bernin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/477,374

(22) PCT Filed: Jan. 10, 2018

(86) PCT No.: PCT/FR2018/050053
§ 371 (c)(1),
(2) Date: Jul. 11, 2019

(87) PCT Pub. No.: WO2018/130780
PCT Pub. Date: Jul. 19, 2018

(65) Prior Publication Data
US 2019/0348462 A1 Nov. 14, 2019

(30) Foreign Application Priority Data
Jan. 11, 2017 (FR) ...................................... 1750237

(51) Int. Cl.
*H01L 27/146* (2006.01)
*H01L 27/12* (2006.01)

(52) U.S. Cl.
CPC .... *H01L 27/14643* (2013.01); *H01L 27/1203* (2013.01); *H01L 27/14629* (2013.01); *H01L 27/14683* (2013.01)

(58) Field of Classification Search
CPC ......... H01L 21/02109; H01L 21/02365; H01L 21/02518; H01L 21/02381;
(Continued)

(56) References Cited

U.S. PATENT DOCUMENTS

| 6,515,335 B1 * | 2/2003 | Christiansen ..... H01L 21/02381 257/189 |
| 2005/0093100 A1 * | 5/2005 | Chen ................... H01L 31/1812 257/616 |

(Continued)

FOREIGN PATENT DOCUMENTS

| FR | 2789517 B1 | 3/2001 |
| WO | 2005/043614 A3 | 5/2005 |

OTHER PUBLICATIONS

Huang et al., SiGe-on-Insulator Prepared by Wafer Bonding and Layer Transfer for High Performance Field-Effect Transistors, Applied Physics Letters, vol. 78, Issue 9, abstract only.
(Continued)

*Primary Examiner* — Cheung Lee
(74) *Attorney, Agent, or Firm* — TraskBritt

(57) ABSTRACT

A substrate for a front-side-type image sensor includes, successively, a supporting semiconductor substrate, an electrically insulating layer, and a semiconductor layer, known as the active layer. The active layer is an epitaxial layer of silicon-germanium having a germanium content of less than 10%. The disclosure also relates to a method for the production of such a substrate.

22 Claims, 9 Drawing Sheets

(58) Field of Classification Search
CPC ......... H01L 21/02532; H01L 21/02664; H01L 21/76254; H01L 27/1203; H01L 27/14629; H01L 27/14643; H01L 27/14683

See application file for complete search history.

(56) References Cited

U.S. PATENT DOCUMENTS

| | | |
|---|---|---|
| 2016/0118431 A1 | 4/2016 | Dutartre |
| 2018/0233528 A1* | 8/2018 | Na .................... H01L 31/109 |
| 2019/0164811 A1* | 5/2019 | Kweskin ............ H01L 21/324 |

OTHER PUBLICATIONS

International Search Report for International Application No. PCT/FR2018/050053 dated Apr. 4, 2018, 3 pages.
International Written Opinion for International Application No. PCT/FR2018/050053 dated Apr. 4, 2018, 6 pages.
Nakaharai et al., Characterization of 7-nm-Thick Strained Geon-Insulator Layer Fabricated by Ge-Condensation Technique, Applied Physics Letters, vol. 83, Issue 17, abstract only.
European Communication pursuant to Article 94(3) EPC for European Application No. 18702752, dated May 20, 2020, 5 pages.
Gao et al., "Ge diffusion and solid phase epitaxy growth to form Si1-xGex/Si and Ge on insulator structure", cited as XP025006070, Thin Solid Films 504 (2006) pp. 69-72.
Singapore Written Opinion for SG Application No. 11201906083Q dated Jul. 1, 2020, 5 pages.

* cited by examiner

SUBSTRATE FOR FRONT SIDE TYPE IMAGER AND METHOD OF MANUFACTURING SUCH A SUBSTRATE

CROSS-REFERENCE TO RELATED APPLICATIONS

This application is a national phase entry under 35 U.S.C. § 371 of International Patent Application PCT/FR2018/050053, filed Jan. 10, 2018, designating the United States of America and published in French as International Patent Publication WO 2018/130780 A1 on Jul. 19, 2018, which claims the benefit under Article 8 of the Patent Cooperation Treaty to French Patent Application Serial No. 1750237, filed Jan. 11, 2017.

TECHNICAL FIELD

The present disclosure relates to a substrate for a "front side" type imager, an imager incorporating such a substrate, and a method of manufacturing such a substrate.

BACKGROUND

The document US 2016/0118431 describes a "front side" type imager.

As illustrated in FIG. 1, the imager comprises a SOI (Semiconductor-On-Insulator) type substrate comprising, from its rear side to its front side, a silicon support substrate 1' having a certain doping, a silicon oxide layer 2', and a monocrystalline silicon layer 3' designated active layer having a doping that can be different to that of the support substrate 1', in which is defined a matrix array of photodiodes each defining a pixel.

However, such an imager has low sensitivity in the near infrared, that is to say, for wavelengths between 700 nm and 3 µm.

Indeed, the active silicon layer 3' has a coefficient of absorption that decreases markedly with the wavelength of the radiation to which it is exposed, namely around $10^6$ cm$^{-1}$ for a wavelength of 300 nm to several $10^3$ cm$^{-1}$ from 700 nm.

However, monocrystalline silicon is, at the moment, the favored material to form the active layer of the substrate for the imager, because it has the advantage of being compatible with microelectronic methods enabling the manufacture of the imager, and of having a crystalline quality (in particular, an absence of dislocations) suitable to the function of the active layer.

BRIEF SUMMARY

An aim of the present disclosure is to overcome the aforementioned problem and to propose a substrate for a "front side" type imager which makes it possible to increase the absorption of light in the near infrared while respecting the constraints of compatibility with the method of manufacturing the imager and the crystalline quality of the active layer.

To this end, the disclosure proposes a substrate for a front side type imager, successively comprising a semiconductor support substrate, an electrically insulating layer and a semiconductor active layer, characterized in that the active layer is an epitaxial layer made of silicon-germanium, the germanium content of the silicon-germanium layer being less than 10%.

By "epitaxial layer" is meant a layer grown by epitaxy, as described in the subsequent description.

"Front side" is taken to mean in the present text the side of the imager intended to be exposed to light radiation, which is located on the same side of the substrate as the associated electronic components.

Advantageously, the germanium content of the active layer is less than or equal to 8%.

Preferably, the thickness of the active layer is less than a critical thickness of the silicon-germanium layer defined as being a thickness beyond which silicon-germanium relaxation takes place.

According to one embodiment, the substrate further comprises a silicon layer between the electrically insulating layer and the silicon-germanium layer.

According to one embodiment, the electrically insulating layer is made of silicon oxide.

The thickness of the electrically insulating layer is between 10 and 200 nm.

According to another embodiment, the electrically insulating layer comprises a stack of dielectric and/or metal layers chosen in such a way that the reflectivity of the stack in a range of wavelengths between 700 nm and 3 µm is greater than the reflectivity of a silicon oxide layer having a thickness equal to that of the stack.

According to one particular embodiment, the electrically insulating layer successively comprises, from the support substrate to the active layer, a silicon oxide layer, a titanium nitride layer and a silicon oxide layer.

The disclosure also relates to a front side imager comprising such a substrate and a matrix array of photodiodes in the active layer of the substrate.

Another object of the disclosure relates to a method of manufacturing such a substrate.

The method comprises the following steps:

provision of a donor substrate comprising a semiconductor material suitable for the epitaxial growth of silicon-germanium;

provision of a support substrate;

bonding of the donor substrate on the support substrate, an electrically insulating layer being at the bonding interface;

thinning of the donor substrate so as to transfer a layer of the semiconductor material onto the support substrate; and epitaxial growth, on the transferred layer of semiconductor material, of a silicon-germanium layer whose germanium content is less than 10%, preferably less than or equal to 8%.

According to one embodiment, the semiconductor material of the donor substrate suitable for the epitaxial growth of silicon-germanium is silicon-germanium.

The semiconductor material may be formed by epitaxy on a base substrate, the semiconductor material and the base substrate together forming the donor substrate.

According to another embodiment, the semiconductor material of the donor substrate suitable for the epitaxial growth of silicon-germanium is silicon.

Advantageously, the thickness of the silicon layer transferred onto the support substrate is less than or equal to 400 nm.

At the end of the epitaxial growth of silicon-germanium, the silicon layer may be conserved between the electrically insulating layer and the silicon-germanium layer.

Alternatively, the method may further comprise a step of condensation of the silicon-germanium of the active layer so as to convert the silicon layer from which the epitaxial growth of silicon-germanium has been carried out into a silicon-germanium layer.

In a particularly advantageous manner, the method comprises a step of formation of an embrittlement zone in the donor substrate so as to delimit a layer of the semiconductor material suitable for the epitaxial growth of silicon-germanium, and the thinning of the donor substrate comprises a detachment along the embrittlement zone.

Preferably, the formation of the embrittlement zone comprises an implantation of atomic species in the donor substrate.

According to one particular embodiment, the electrically insulating layer is formed by deposition, on the support substrate, of a stack of dielectric and/or metal layers chosen in such a way that the reflectivity of the stack in a range of wavelengths comprised between 700 nm and 3 μm is greater than the reflectivity of a silicon oxide layer having a thickness equal to that of the stack.

In this case, a sacrificial oxide layer is advantageously formed on the donor substrate before the implantation of the atomic species to form the embrittlement zone, the implantation of the atomic species being carried out through the sacrificial layer, the sacrificial oxide layer being removed before bonding of the donor substrate on the support substrate.

BRIEF DESCRIPTION OF THE DRAWINGS

Other characteristics and advantages of the disclosure will become clear from reading the detailed description that follows, with reference to the appended drawings, in which.

For reasons of legibility of the figures, the different layers are not necessarily represented to scale.

DETAILED DESCRIPTION

Figure 1:
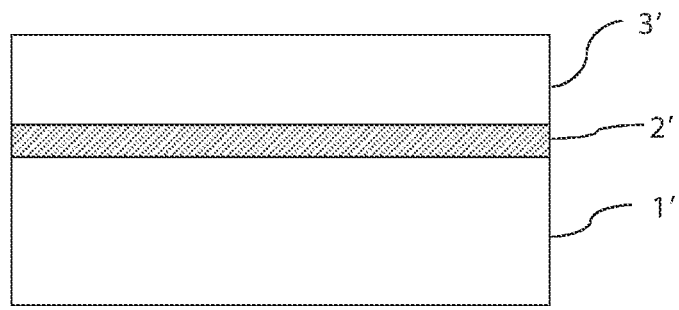
FIG. 1 is a sectional view of a SOI substrate for a front side imager as described in the document US 2016/0118431.
Figure 2:
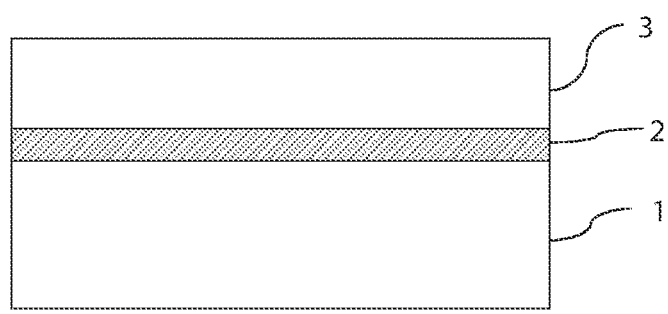
FIG. 2 is a sectional view of a substrate according to one embodiment of the present disclosure.

FIG. 2 is a sectional view of a substrate for a front side imager according to one embodiment of the disclosure.

The substrate successively comprises, from its rear side to its front side, a semiconductor support substrate 1, an electrically insulating layer 2 and a monocrystalline silicon-germanium (SiGe) layer 3 designated active layer.

The support substrate 1 is generally obtained by cutting of a monocrystalline ingot. Advantageously, the support substrate 1 is made of silicon.

According to one embodiment, the electrically insulating layer is a silicon oxide layer.

Advantageously, the thickness of the electrically insulating layer is comprised between 10 and 200 nm.

The active layer 3 is intended to receive a matrix array of photodiodes (not represented) enabling the capture of images. The thickness of the active layer 3 is typically greater than or equal to 1 μm, or even greater than 2 μm. The layer 3 may be lightly doped.

Figure 3:
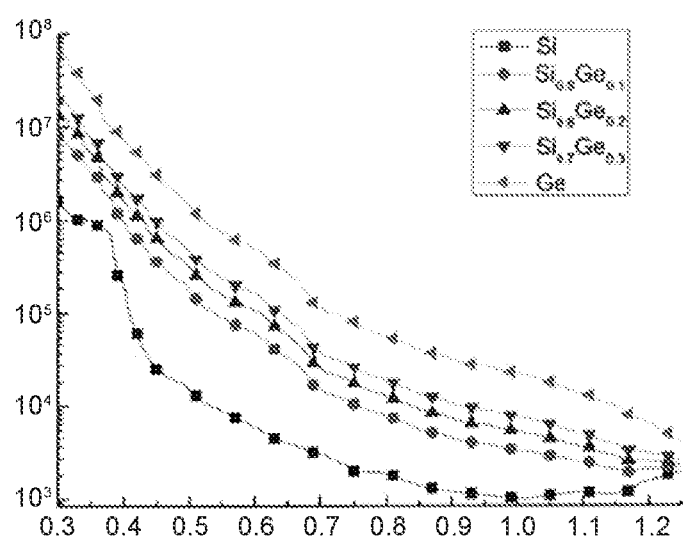
FIG. 3 shows the coefficient of absorption of silicon-germanium as a function of wavelength for different germanium contents.

As may be seen in FIG. 3, which illustrates the coefficient of absorption (in $cm^{-1}$) of SiGe as a function of wavelength (in μm) for different compositions of the material, the coefficient of absorption, in particular, in the infrared, increases with the germanium content.

However, the design of the active layer 3 does not only concern the concentration of germanium but also the thickness of the layer. Indeed, since the SiGe layer is formed by epitaxy on a silicon substrate, the lattice parameter of which is different to that of silicon-germanium, relaxation of the SiGe layer takes place beyond a certain thickness, which is referred to as the "critical thickness." This relaxation results in the formation of dislocations within the SiGe layer.

Such dislocations would make the SiGe layer inappropriate for the function of the active layer 3 and, thus, must be avoided.

Figure 4:
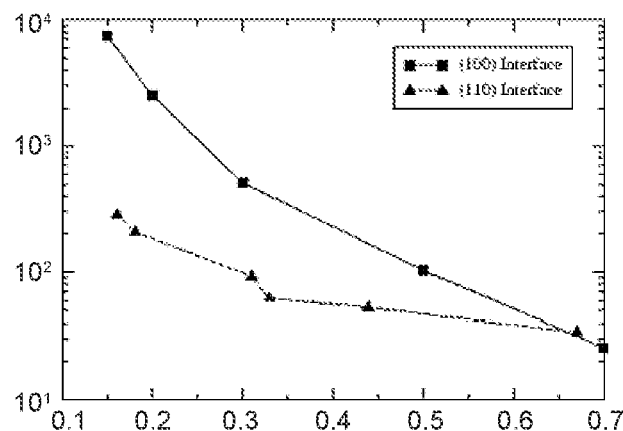
FIG. 4 shows the critical thickness of a silicon-germanium layer as a function of the germanium content thereof.

As shown in FIG. 4, which illustrates the critical thickness (in Å) of a SiGe layer as a function of the germanium content (stoichiometric coefficient x corresponding to the composition $Si_{1-x}Ge_x$), the critical thickness decreases with increasing germanium concentration.

The thickness of the active layer 3 and the germanium concentration of the layer thus result from a compromise between:

- on the one hand, a sufficiently large thickness to capture a maximum of photons in the wavelengths of the near infrared,
- on the other hand, a sufficient concentration of germanium to increase the capacity to absorb photons by the active layer, in particular, in the near infrared, and
- a limited thickness (depending on the concentration) to avoid silicon-germanium relaxation and the creation of crystalline defects (dislocations) that result therefrom.

Typically, it is sought to maximize the thickness and the germanium concentration of the active layer 3 in order to have the best possible absorption in the infrared while minimizing dislocations in the active layer.

The germanium content of the active layer is less than 10%, preferably less than or equal to 8%. FIG. 4 shows in fact that the critical thickness of a $Si_{0.9}Ge_{0.1}$ layer is on the order of a micrometer, which is suitable for the active layer of a "front side" type imager. For a $Si_{0.92}Ge_{0.08}$ layer, the critical thickness is greater than 2 μm; besides, the absorption coefficient at a wavelength equal to 940 nm is three to four times greater than that of silicon.

As compared to a silicon-germanium layer made by thermal mixing as described in document WO 2005/043614, the silicon-germanium epitaxial active layer implemented in the present disclosure exhibits a greater uniformity and may be achieved with lower cost. Indeed, obtaining a silicon-germanium layer by thermal mixing implies the formation of a stack constituted (from its free surface to a substrate forming a mechanical support) of a silicon-germanium layer with a high germanium content e.g., with a germanium content of the order of 80%), a thick silicon layer (substantially corresponding to the desired thickness of the final silicon-germanium layer) and a barrier layer preventing any diffusion of the germanium atoms into the underlying substrate. However, the thicker the silicon layer, the greater the duration of the process (the duration including the duration of the epitaxy of the silicon layer followed by the duration of the heat treatment of the silicon-germanium layer to cause the germanium atoms to diffuse into the silicon layer). In practice, the thermal mixing process is thus not adapted to the formation of an active layer having a thickness on the order of 1 μm, which is required for an imager. In any case, an epitaxial layer may be distinguished from a layer formed by thermal mixing by measuring the quantity of dislocations and the relaxation of the layer.

Examples of methods of manufacturing the substrate illustrated in FIG. 2 are described below.

Generally speaking, the method of manufacturing a substrate according to the present disclosure comprises the following steps.

On the one hand, a donor substrate is provided comprising a semiconductor material suitable for the epitaxial growth of silicon-germanium. The material may, in particular, be SiGe (enabling homoepitaxy) or a material different to SiGe but having a lattice parameter sufficiently close to that of SiGe to enable the epitaxial growth thereof (heteroepitaxy). In this latter case, the semiconductor material is advantageously silicon.

On the other hand, a receiver substrate is provided, and the donor substrate is bonded onto the receiver substrate, an electrically insulating layer being present at the bonding interface.

The donor substrate is next thinned so as to transfer a layer of the semiconductor material onto the receiver substrate.

This thinning may be carried out by polishing or etching of the semiconductor material so as to obtain the thickness and the surface state desired for the epitaxy of SiGe.

However, advantageously, before the bonding step, an embrittlement zone is formed in the semiconductor material so as to delimit a superficial layer to transfer. After the bonding step, the thinning consists in detaching the donor substrate along the embrittlement zone, which leads to the transfer of the superficial layer onto the receiver substrate. Typically, the thickness of the transferred layer is less than or equal to 400 nm. Potentially, a finishing treatment of the free surface of the transferred layer is carried out in order to favor the implementation of the epitaxy, the treatment being able to lead to thinning of the transferred layer.

Finally, on the transferred layer of semiconductor material, which serves as a seed layer, the epitaxial growth of a layer of silicon-germanium is implemented until the desired thickness is obtained for the active layer.

It will be noted that, when the seed layer is not made of SiGe, for example, when it is made of silicon, at the end of the epitaxy of SiGe, the seed layer under the active layer 3 remains.

Figure 5:
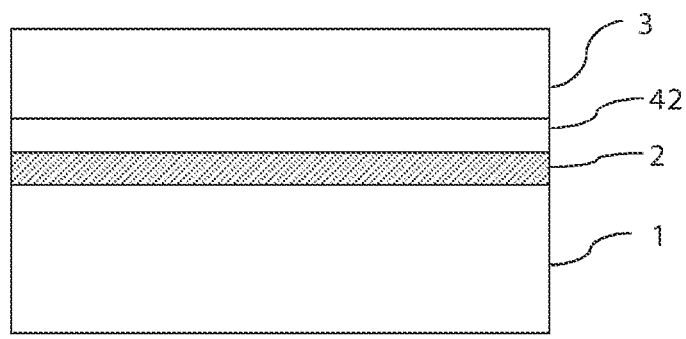
FIG. 5 is a sectional view of a substrate according to an alternative embodiment of the disclosure.

This situation is illustrated in FIG. 5, which corresponds to one particular embodiment of the present disclosure. The seed layer is designated by the reference character 42.

The seed layer 42 is sufficiently thin (of a thickness less than or equal to 300 nm) compared to the thickness of the active layer so as not to affect notably the properties of the active SiGe layer in terms of absorption in the infrared.

However, it is possible to remove the seed layer, for example, by means of a condensation method. In a manner known per se, the method comprises an oxidation of the SiGe layer, the oxidation having the effect of consuming uniquely the silicon (to form silicon oxide) and to make the germanium migrate to the face opposite to the free surface of the SiGe layer. A $SiO_2$ layer, which can be removed by etching, is then formed on the surface.

According to a first embodiment, illustrated in FIGS. 6A to 6F, the starting point is a donor substrate 30 comprising a superficial SiGe layer 31.

The SiGe layer 31 is typically formed by epitaxy on a base substrate 32, generally made of silicon. The SiGe layer 31 is sufficiently thin to be stressed.

Figure 6A:
FIGS. 6A to 6F illustrate the main steps of a method of manufacturing a substrate for a front side imager according to one embodiment of the disclosure.
Figure 6B:
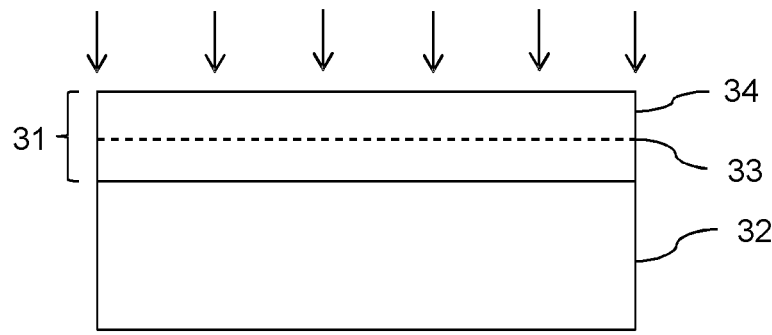

In a first version of this embodiment, an embrittlement zone 33 is formed in the SiGe layer, as illustrated in FIG. 6B.

In a particularly advantageous manner, the embrittlement zone 33 is formed by implantation of atomic species (typically, hydrogen and/or helium) through the free surface of the SiGe layer 31. The embrittlement zone 33 thereby delimits a SiGe layer 34 at the surface of the donor substrate.

Figure 6C:
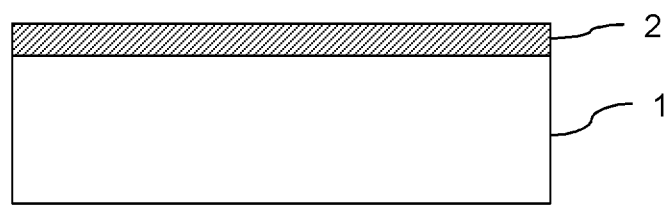

With reference to FIG. 6C, a receiver substrate is moreover provided comprising a support substrate 1 and an electrically insulating layer 2.

Figure 6D:
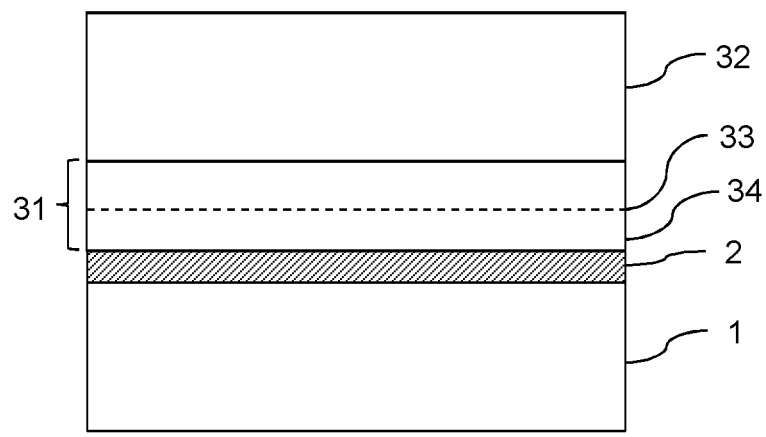

With reference to FIG. 6D, the donor substrate is bonded onto the receiver substrate, the SiGe layer 31 and the electrically insulating layer 2 being present at the bonding interface.

Figure 6E:
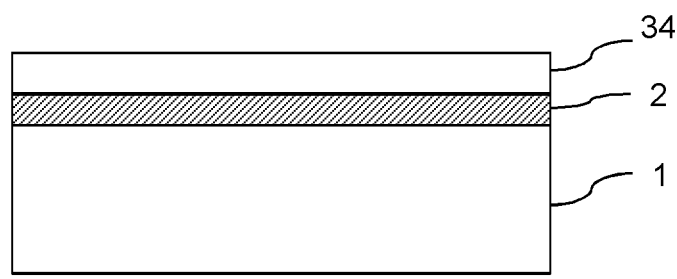

Next, as illustrated in FIG. 6E, the donor substrate is detached along the embrittlement zone. The detachment may be initiated by any technique known in the art, such as by application of mechanical, chemical, and/or thermal stress.

The SiGe layer 34 is thereby transferred onto the support substrate.

If need be, a surface treatment of the SiGe layer is carried out to remove defects resulting from the implantation or the detachment process, and to make it sufficiently smooth for the subsequent epitaxy process.

Figure 7A:
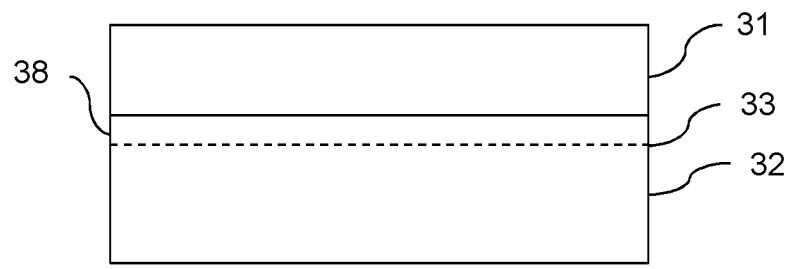
FIGS. 7A to 7C illustrate the steps of an alternative of the manufacturing method illustrated in FIGS. 6A to 6F.

In a second version of this embodiment, an embrittlement zone 33 is formed in the donor substrate 30 situated under the SiGe layer 31 (cf. FIG. 7A).

In a particularly advantageous manner, the embrittlement zone 33 is formed by implantation of atomic species (typically, hydrogen and/or helium) through the free surface of the SiGe layer 31. The embrittlement zone 33 thereby delimits a SiGe layer and a portion 38 of the base substrate 32 on the surface of the donor substrate.

With reference to FIG. 6C, a receiver substrate is moreover provided comprising a support substrate 1 and an electrically insulating layer 2.

Figure 7B:
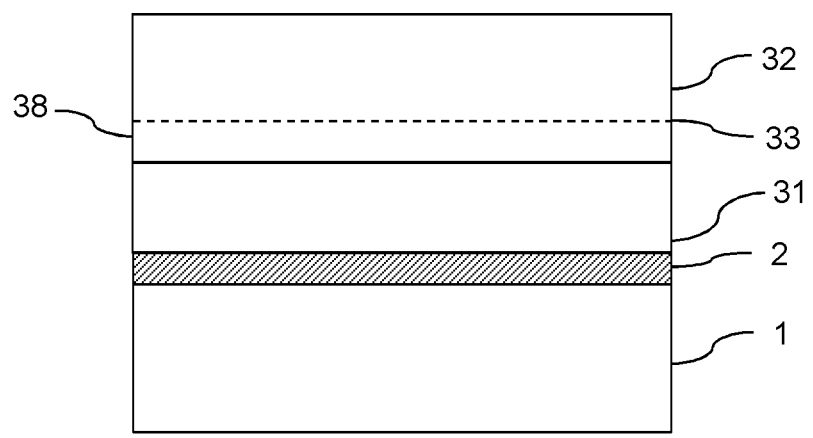

With reference to FIG. 7B, the donor substrate is bonded on the receiver substrate, the SiGe layer 31 and the electrically insulating layer 2 being at the bonding interface.

Next, the donor substrate is detached along the embrittlement zone 33. The detachment may be initiated by any technique known to those skilled in the art, such as by application of mechanical, chemical, and/or thermal stress.

Figure 7C:
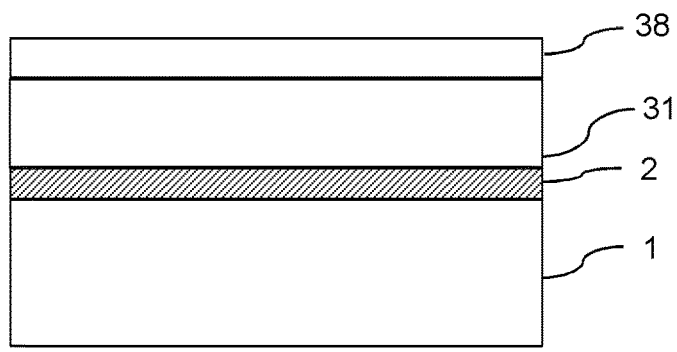

The SiGe layer 31 and the portion 38 of the base substrate are thereby transferred onto the support substrate to form the structure shown in FIG. 7C.

A treatment of the surface created is then carried out to remove the portion 38 of the superficial donor substrate until a surface of SiGe is revealed, thereby removing defects linked to the ion implantation and to the detachment, and making it sufficiently smooth for the subsequent epitaxy process.

As in FIG. 6E, a portion 38 of the SiGe layer 31 on the support substrate 1 is thereby obtained.

Figure 6F:
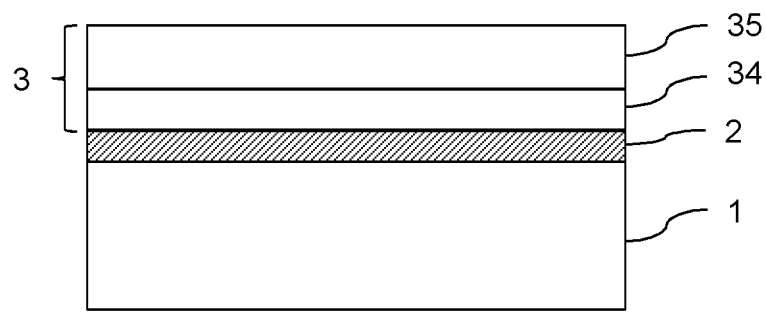

As illustrated in FIG. 6F (step common to the two versions of the embodiment), epitaxy is then resumed in order to make a SiGe layer 35 grow on the transferred SiGe layer 34, which fulfils the role of seed layer, up to the desired thickness for the active layer 3, which is formed of both of the two SiGe layers 34 and 35 together. During epitaxy, it is possible to dope lightly the SiGe layer 35, depending on the desired electrical properties. The doping of the SiGe layer 35 is not necessarily identical to that of the seed SiGe layer 34.

The substrate illustrated in FIG. 2 is thereby obtained.

According to a second embodiment, illustrated in FIGS. 8A to 8D, the well-known Smart Cut™ method is used to form a SOI substrate comprising the support substrate, the electrically insulating layer, and a silicon seed layer intended for the epitaxial growth of the SiGe layer.

Figure 8A:
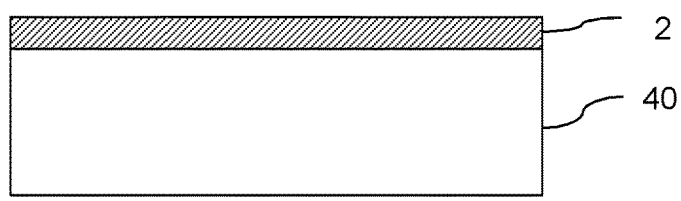
FIGS. 8A to 8D illustrate the main steps of a method of manufacturing a substrate for a front side imager according to one embodiment of the disclosure.
Figure 8B:
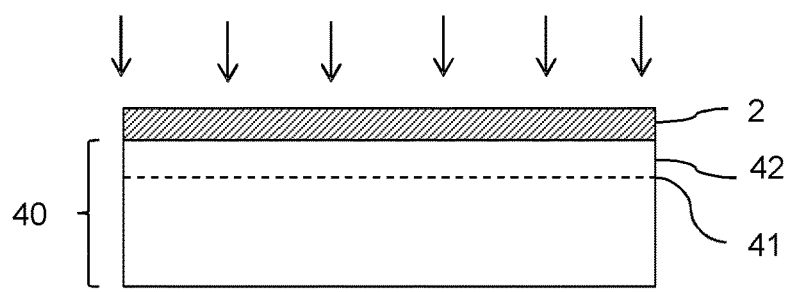

To this end, a silicon donor substrate 40 covered by the electrically insulating layer 2 as shown in FIG. 8A is provided, then an embrittlement zone 41 delimiting a silicon layer 42 to transfer is formed by implantation of atomic species, as shown in FIG. 8B.

A receiver substrate is moreover provided, which is typically the support substrate 1 of the final substrate.

Figure 8C:
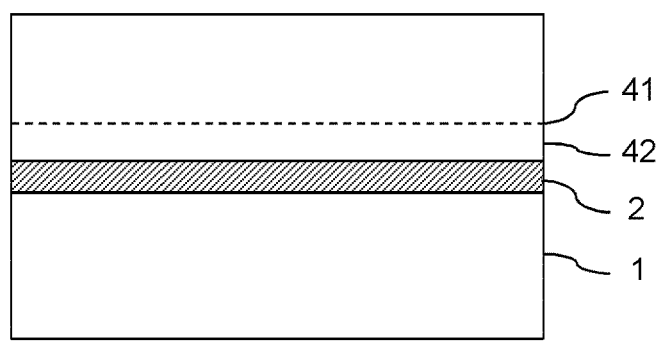

With reference to FIG. 8C, the donor substrate 40 is bonded on the receiver support substrate 1, the electrically insulating layer 2 being present at the bonding interface.

Next, the donor substrate is detached along the embrittlement zone. The detachment may be initiated by any technique known to those skilled in the art, such as by application of mechanical, chemical, and/or thermal stress.

Figure 8D:
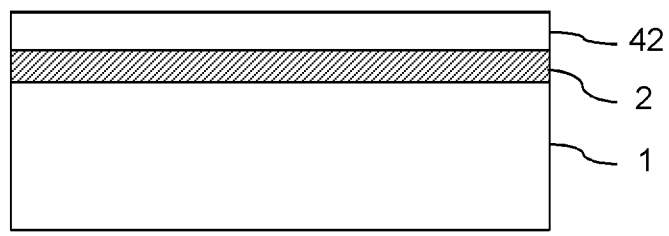

The silicon layer 42 is thereby transferred onto the support substrate 1 as shown in FIG. 8D.

If need be, a surface treatment of the silicon layer is carried out to remove defects linked to the ion implantation and to the detachment, and to make it sufficiently smooth for the subsequent epitaxy process.

Epitaxy of SiGe on the transferred silicon layer 42 that serves as a seed layer is then resumed, up to the desired thickness for the active layer 3. During epitaxy, it is possible to lightly dope the active layer 3, depending on the desired electrical properties.

The substrate illustrated in FIG. 5 is thereby obtained.

As mentioned above, the silicon seed layer may be conserved for the formation of the imager. Alternatively, the silicon layer may be removed by means of the aforementioned condensation method.

According to one particular embodiment of the disclosure, the electrically insulating layer 2 is not, as in conventional SOI substrates, a silicon oxide layer, but comprises a stack of dielectric and/or metal layers chosen so as to increase the reflectivity of the electrically insulating layer in the infrared range of wavelengths. More precisely, the dielectric and/or metal layers forming this stack are chosen in such a way that the reflectivity of the stack in a range of wavelengths between 700 nm and 3 µm is greater than the reflectivity of a silicon oxide layer having a thickness equal to that of the stack. Furthermore, a metal layer of the stack is advantageously separated from the support substrate and from the active layer by at least one dielectric layer. The dielectric layers thus ensure, in particular, a function of electrical insulation of the active layer vis-à-vis the support substrate.

Figure 9:
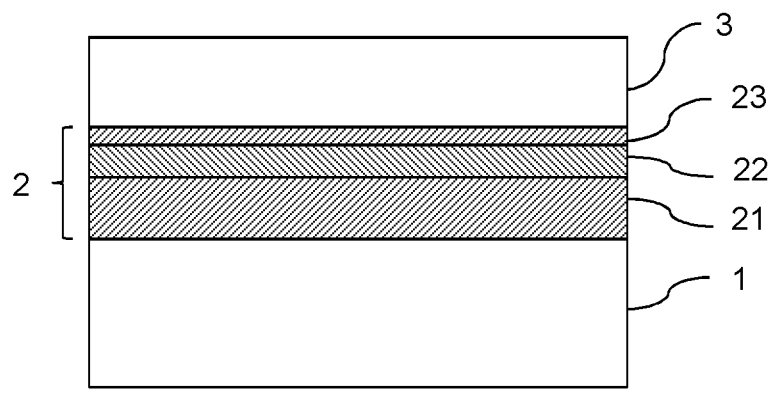
FIG. 9 is a sectional view of a substrate according to a particular embodiment of the disclosure.

For example, as illustrated in FIG. 9, the electrically insulating layer 2 successively comprises:
a first silicon oxide layer 21 at the interface with the support substrate 1,
a titanium nitride layer 22, and
a second silicon oxide layer 23, at the interface with the active layer 3.

Titanium nitride is a widely used material widely used in microelectronics.

The dielectric silicon oxide layers 21 and 23 make it possible to encapsulate the titanium nitride layer and thereby avoid any metal contamination of the active layer. The generation of electrical defects at the interface between the active layer and the electrically insulating layer and recombinations between the SiGe of the active layer and the metal components of the imager, capable of doping the active layer, are thereby avoided.

Typically, the layer 21 has a thickness between 300 and 500 nm, the layer 23 has a thickness between 10 and 50 nm, and the layer 22 has a thickness between 10 and 100 nm.

Such an electrically insulating layer 2 has the advantage of reflecting more photons transmitted through the active layer 3 than a silicon oxide layer of identical thickness.

Figure 10:
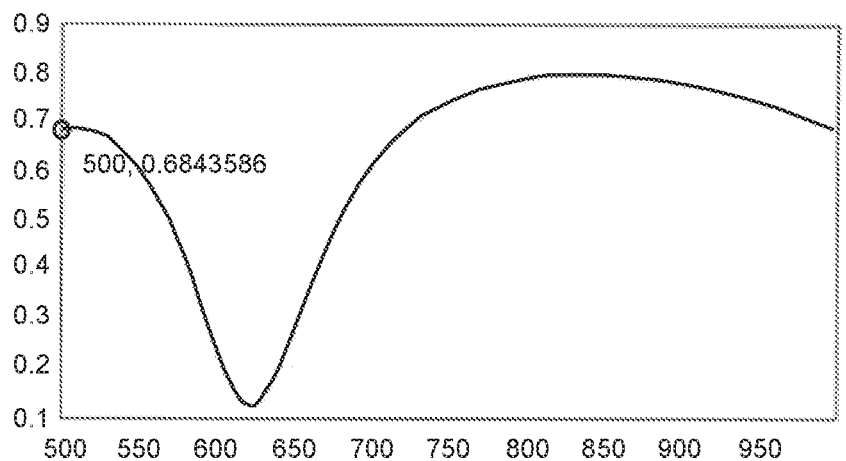
FIG. 10 illustrates the reflectivity of a stack of dielectric layers as a function of wavelength (in nm)

This is visible in FIG. 10, which shows the reflectivity of the following stack (from the support substrate to the active layer) as a function of wavelength (in nm):
the first silicon oxide layer 21, of 400 nm thickness,
the titanium nitride layer 22, of 50 nm thickness, and
the second silicon oxide layer 23, of 20 nm thickness.

A reflectivity reaching 0.8 for a wavelength of 850 nm is thereby obtained. As a comparison, a 400 nm layer of silicon oxide has a reflectivity of 0.5 for a wavelength of 850 nm.

This increased reflectivity has the effect of increasing the length of the path of the photons within the active layer 3, and thereby of favoring their absorption by the layer.

Thus, with the simultaneous use of the active silicon-germanium layer and the stack of dielectric and/or metal layers forming the electrically insulating layer, the favorable effects of these two layers on the absorption of infra-red radiation are combined.

In this case, the method of manufacturing the substrate is adapted in the following manner.

Compared to the methods described above, when the layer to transfer (whether it is a SiGe layer or a silicon layer) is delimited in the donor substrate by an embrittlement zone formed by ion implantation, the stack of dielectric and/or metal layers is not formed on the donor substrate but on the support substrate. Indeed, such a stack would be too thick for the implantation. On the other hand, advantageously, before implantation, a sacrificial silicon oxide layer, through which the atomic species intended to form the embrittlement zone are implanted, is formed on the donor substrate. The sacrificial layer makes it possible to avoid the channeling effect during implantation. The sacrificial layer is next removed from the donor substrate before the bonding thereof on the support substrate.

FIGS. 11A to 11E illustrate a preferred embodiment of a substrate for a front side imager comprising such a stack of dielectric layers. The elements designated by the same reference signs as in the preceding figures, in particular, FIGS. 8A-8D, designate the same elements. However, those skilled in the art could also apply the above method to the case where the transferred seed layer is a SiGe layer as in the method described with reference to FIGS. 6A-6F or 7A-7C.

Figure 11A:
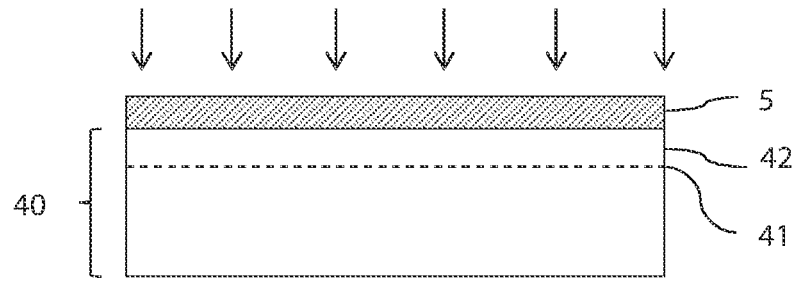
FIGS. 11A to 11E illustrate the main steps of a method of manufacturing a substrate for front side imager according to one embodiment of the disclosure.

With reference to FIG. 11A, a silicon donor substrate 40 covered by a sacrificial silicon oxide layer 5 is provided, then an embrittlement zone 41 delimiting a silicon layer 42 to transfer is formed by implantation of atomic species through the sacrificial silicon oxide layer 5. After the implantation, the sacrificial silicon oxide layer 5 is removed, for example, by chemical etching.

Figure 11B:
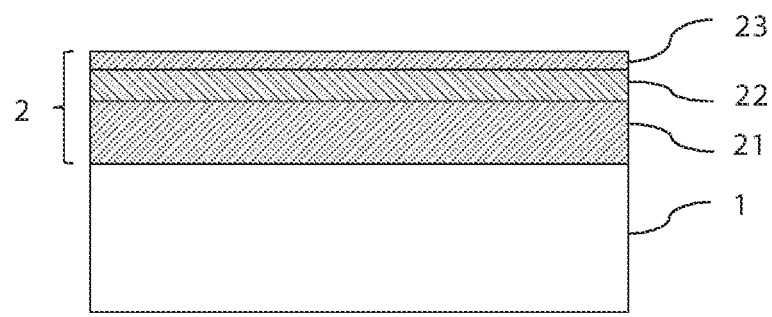

With reference to FIG. 11B, a receiver substrate is provided, which is typically the support substrate 1 of the final substrate, on which the stack of layers 21, 22, 23 intended to form the electrically insulating layer 2 is formed.

Figure 11C:
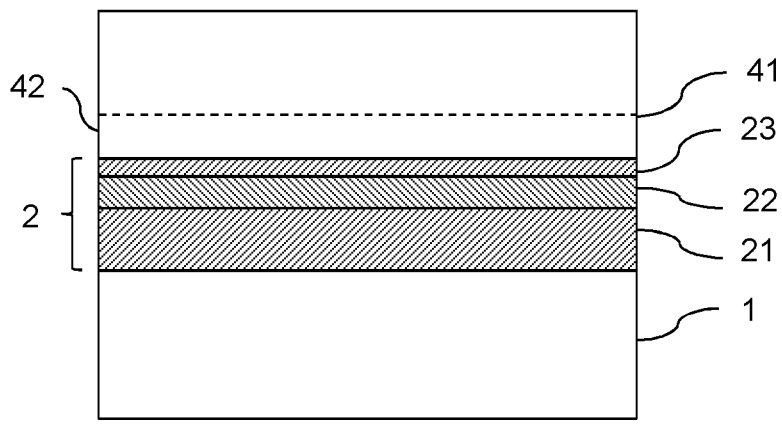

With reference to FIG. 11C, the donor substrate 40 is bonded onto the support substrate 1, the stack of dielectric and/or metal layers forming the electrically insulating layer 2 being located at the bonding interface.

Next, the donor substrate is detached along the embrittlement zone 41. The detachment may be initiated by any technique known to those skilled in the art, such as by application of mechanical, chemical, and/or thermal stress.

Figure 11D:
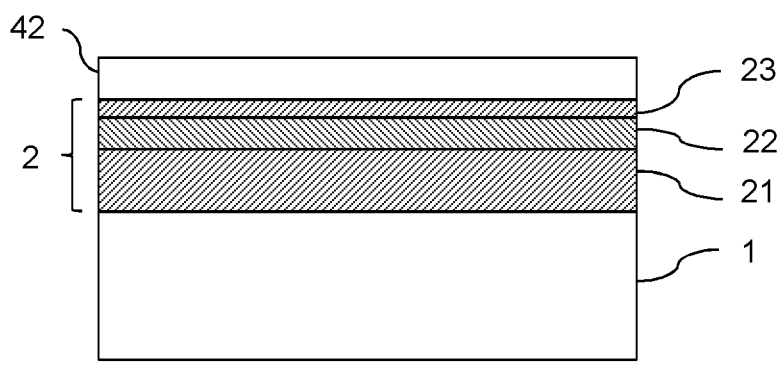

The silicon layer 42 is thereby transferred onto the support substrate 1 (cf. FIG. 11D).

If need be, a surface treatment of the silicon layer is carried out to remove defects linked to the implantation and to the detachment, and to make it sufficiently smooth for the epitaxy step that is going to follow.

Figure 11E:
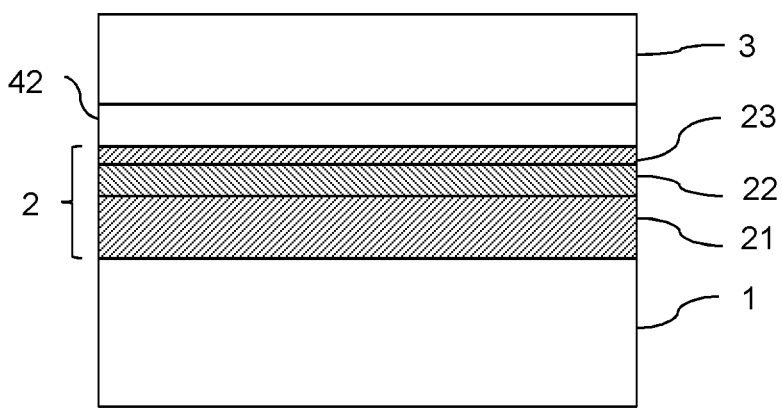

With reference to FIG. 11E, epitaxy of SiGe on the transferred silicon layer 42 that serves as seed layer is then resumed up to the desired thickness for the active layer 3. During epitaxy, it is possible to lightly dope the active layer 3, depending on the desired electrical properties.

Figure 12:
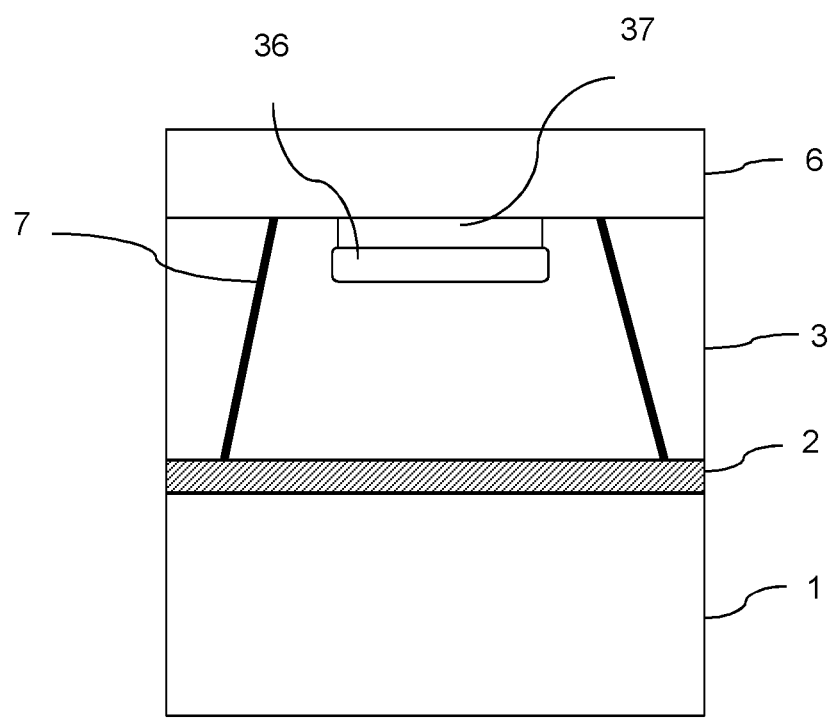
FIG. 12 is a sectional view of a pixel of a "front side" type imager comprising a substrate according to one embodiment of the disclosure.

FIG. 12 illustrates a part of a front side type imager comprising a substrate according to one embodiment of the disclosure corresponding to FIG. 2, but not limited thereto. Only a part of the imager corresponding to a pixel is represented in this FIG., the pixel being electrically insulated from the other pixels formed in the active layer 3 by insulation trenches 7.

A doped region 36 of type different to that of the active layer 3 is formed under the surface of the front side of the active layer 3. This region 36 forms with the active layer 3 a photodiode. A region 37 formed between the region 36 and the front side of the active layer 3 advantageously has a doping level greater than that of the region 36 in order to passivate the interface. A passivation layer 6 is formed on the active layer 3 and may encapsulate elements making it possible to control the pixel electrically.

Potentially, other layers, such as filters, may be formed on the passivation layer 6, but they are not represented in FIG. 12.

The structure of the imager as such and its method of manufacture are known to those skilled in the art and thus are not described in detail herein.

The invention claimed is:

1. A substrate for a front side type imager, successively comprising:
    a semiconductor support substrate;
    an electrically insulating layer consisting of electrically insulating material;
    a bonding interface, the electrically insulating layer being present at the bonding interface;
    a semiconductor active layer comprising an epitaxial layer of silicon-germanium, the germanium content of the active layer being less than 10%; and
    wherein a thickness of the active layer is less than a critical thickness of the silicon-germanium epitaxial layer defined as being a thickness beyond which silicon-germanium relaxation takes place.

2. The substrate of claim 1, wherein the germanium content of the active layer is less than or equal to 8%.

3. The substrate of claim 1, wherein a thickness of the active layer is greater than 1 µm.

4. The substrate of claim 1, further comprising a silicon layer between the electrically insulating layer and the active layer.

5. The substrate of claim 1, wherein the electrically insulating layer is made of silicon oxide.

6. The substrate of claim 1, wherein a thickness of the electrically insulating layer is between 10 and 200 nm.

7. The substrate of claim 1, wherein the electrically insulating layer comprises a stack of dielectric layers, and wherein a reflectivity of the stack in a range of wavelengths between 700 nm and 3 µm is greater than a reflectivity of a silicon oxide layer having a thickness equal to that of the stack.

8. A substrate for a front side type imager, successively comprising:
    a semiconductor support substrate;
    an electrically insulating layer, wherein the electrically insulating layer comprises a stack of dielectric layers, and wherein a reflectivity of the stack in a range of wavelengths between 700 nm and 3 µm is greater than a reflectivity of a silicon oxide layer having a thickness equal to that of the stack; and
    a semiconductor active layer comprising an epitaxial layer of silicon-germanium, the germanium content of the active layer being less than 10%;
    wherein the electrically insulating layer successively comprises, from the support substrate to the active layer, a silicon oxide layer, a titanium nitride layer and a silicon oxide layer.

9. A front side imager, comprising:
    a substrate for a front side type imager, successively comprising:
        a semiconductor support substrate;
        an electrically insulating layer consisting of electrically insulating material; and
        a semiconductor active layer comprising an epitaxial layer of silicon-germanium, the germanium content of the active layer being less than 10%; and
    a matrix array of photodiodes in the active layer of the substrate.

10. A method of manufacturing a substrate for a front side type imager, comprising the following steps:
    providing a base substrate comprising a semiconductor material suitable for epitaxial growth of silicon-germanium;
    epitaxially growing the semiconductor material on the base substrate, the semiconductor material and the base substrate together forming a donor substrate;
    providing a support substrate;
    bonding the donor substrate on the support substrate, an electrically insulating layer consisting of electrically insulating material being present at a bonding interface;
    thinning the donor substrate so as to transfer a layer of the semiconductor material onto the support substrate; and
    epitaxially growing, on the transferred layer of semiconductor material, a silicon-germanium layer, the germanium content of the silicon-germanium layer being less than 10%.

11. The method of claim 10, wherein the semiconductor material of the donor substrate suitable for the epitaxial growth of silicon-germanium is silicon-germanium.

12. The method of claim 10, wherein the semiconductor material of the donor substrate suitable for the epitaxial growth of silicon-germanium is silicon.

13. The method of claim 12, wherein a thickness of the silicon layer transferred onto the support substrate is less than or equal to 400 nm.

14. The method of claim 12, wherein, at an end of the epitaxial growth of silicon-germanium, the silicon layer is conserved between the electrically insulating layer and the silicon-germanium layer.

15. The method of claim 12, further comprising a step of condensation of the silicon-germanium of the epitaxial layer so as to convert the silicon layer from which the epitaxial growth of silicon-germanium has been carried out into a silicon-germanium layer.

16. The method of claim 10, further comprising forming an embrittlement zone in the donor substrate so as to delimit a layer of the semiconductor material suitable for the epitaxial growth of silicon-germanium, and wherein the thinning of the donor substrate comprises detaching the donor substrate along the embrittlement zone.

17. The method of claim 16, wherein forming the embrittlement zone comprises implanting atomic species in the donor substrate.

18. The method of claim 10, wherein the electrically insulating layer is formed by deposition, on the support substrate, of a stack of dielectric layers, a reflectivity of the stack in a range of wavelengths between 700 nm and 3 μm being greater than a reflectivity of a silicon oxide layer having a thickness equal to that of the stack.

19. The method of claim 17, wherein the electrically insulating layer is formed by deposition, on the support substrate, of a stack of dielectric layers, a reflectivity of the stack in a range of wavelengths between 700 nm and 3 μm being greater than a reflectivity of a silicon oxide layer having a thickness equal to that of the stack, and wherein a sacrificial oxide layer is formed on the donor substrate before implantation of the atomic species, the implantation of the atomic species being carried out through the sacrificial oxide layer, the sacrificial oxide layer being removed before bonding of the donor substrate on the support substrate.

20. The method of claim 10, wherein a thickness of the silicon-germanium layer is greater than 1 μm.

21. The method of claim 10, wherein a thickness of the silicon-germanium layer is less than a critical thickness of the silicon-germanium layer defined as being a thickness beyond which silicon-germanium relaxation takes place.

22. The method of claim 10, wherein the germanium content of the silicon-germanium layer is less than or equal to 8%.

\* \* \* \* \*